United States Patent
Do et al.

(10) Patent No.: US 8,759,954 B2
(45) Date of Patent: *Jun. 24, 2014

(54) INTEGRATED CIRCUIT PACKAGE SYSTEM WITH OFFSET STACKED DIE

(75) Inventors: Byung Tai Do, Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/197,215

(22) Filed: Aug. 3, 2011

(65) Prior Publication Data
US 2011/0284998 A1 Nov. 24, 2011

Related U.S. Application Data (60) Continuation-in-part of application No. 12/759,158, filed on Apr. 13, 2010, now Pat. No. 8,018,041, which is a division of application No. 11/459,305, filed on Jul. 21, 2006, now Pat. No. 7,727,816.

(51) Int. Cl.
*H01L 23/495* (2006.01)
(52) U.S. Cl.
USPC .......................................... 257/666; 438/123
(58) Field of Classification Search
CPC ................. H01L 23/4951; H01L 24/00; H01L 24/00014; H01L 2224/32245; H01L 23/49575
USPC .......................................... 257/666; 438/123
See application file for complete search history.

(56) References Cited

U.S. PATENT DOCUMENTS

| | | | |
|---|---|---|---|
| 5,586,009 A * | 12/1996 | Burns | 361/735 |
| 5,612,570 A | 3/1997 | Eide et al. | |
| 5,780,925 A | 7/1998 | Cipolla et al. | |
| 6,307,257 B1 | 10/2001 | Huang et al. | |
| 6,353,265 B1 | 3/2002 | Michii | |
| 6,605,875 B2 | 8/2003 | Eskildsen | |
| 6,753,206 B2 | 6/2004 | Huang et al. | |
| 7,049,687 B2 | 5/2006 | Takahashi et al. | |
| 7,071,543 B2 | 7/2006 | Ichikawa | |
| 7,375,415 B2 | 5/2008 | Lee et al. | |
| 8,018,041 B2 * | 9/2011 | Do et al. | 257/686 |
| 2003/0057566 A1 | 3/2003 | Huang et al. | |
| 2005/0029645 A1 | 2/2005 | Mess et al. | |
| 2005/0104166 A1 | 5/2005 | Ichikawa | |
| 2005/0104170 A1 | 5/2005 | Nakamura | |
| 2005/0212144 A1 | 9/2005 | Rugg et al. | |
| 2005/0236698 A1 | 10/2005 | Ozawa et al. | |
| 2006/0214272 A1 | 9/2006 | Seki et al. | |
| 2007/0296086 A1 | 12/2007 | Ju et al. | |
| 2008/0036052 A1 | 2/2008 | Do et al. | |

FOREIGN PATENT DOCUMENTS

TW 499722 B 8/2002

* cited by examiner

*Primary Examiner* — Shaun Campbell
(74) *Attorney, Agent, or Firm* — Ishimaru & Associates LLP (57) ABSTRACT

An integrated circuit package system provides a leadframe having a short lead finger and a long lead finger, and the long lead finger and the short lead finger reside substantially within the same horizontal plane. A first die is placed in the leadframe. A second die is offset from the first die. The offset second die is attached over the first die and the long lead finger with an adhesive. The first die is electrically connected to the short lead finger. The second die is electrically connected to at least the long lead finger or the short lead finger. At least portions of the leadframe, the first die, and the second die are encapsulated in an encapsulant.

9 Claims, 6 Drawing Sheets

INTEGRATED CIRCUIT PACKAGE SYSTEM WITH OFFSET STACKED DIE

CROSS-REFERENCE TO RELATED APPLICATION(S)

This is a continuation of U.S. patent application Ser. No. 12/759,158 filed Apr. 13, 2010, now U.S. Pat. No. 8,018,041, which is a divisional of U.S. patent application Ser. No. 11/459,305, filed Jul. 21, 2006 now U.S. Pat. No. 7,727,816.

TECHNICAL FIELD

The present invention relates generally to semiconductor packages, and more particularly to a system for stacking semiconductor dies.

BACKGROUND ART

The computer industry continually strives toward higher performance, lower cost, increased miniaturization of components, and greater packaging density of integrated circuits ("IC's"). As new generations of IC products are released, their functionality increases while the number of components needed to produce them decreases.

Semiconductor devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a leadframe or on a multi-chip module substrate that is surrounded by a number of lead fingers. Each die has bonding pads that are then individually connected in a wire-bonding operation to the leadframe's lead fingers using extremely fine gold or aluminum wires. The assemblies are then packaged by individually encapsulating them in molded plastic or ceramic bodies.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by the space available for mounting individual dies on a substrate.

To further condense the packaging of individual devices, multi-chip packages have been developed in which more than one device (such as an IC die) can be included in the same package. Of importance to such complicated packaging designs are considerations of input/output lead count, heat dissipation, matching of thermal expansion and contraction between a motherboard and its attached components, costs of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC die that incorporates the same features and functions. Some multi-chip modules consist of a PCB substrate onto which a set of separate IC chip components is directly attached. Other multi-chip modules mount and attach multiple dies on a single leadframe. Following assembly, the multi-chip modules are then encapsulated to prevent damage or contamination. Many such multi-chip modules have greatly increased circuit density and miniaturization, improved signal propagation speed, reduced overall device size and weight, improved performance, and lowered costs—all primary goals of the computer industry.

However, such multi-chip modules can be bulky. IC package density is determined by the area required to mount a die or module on a circuit board. One method to reduce the board size of multi-chip modules is to stack the dies or chips vertically within the module or package. This increases their effective density.

Two of the common die stacking methods are: (a) larger lower die combined with a smaller upper die, and (b) so-called same-size die stacking. With the former, the dies can be very close vertically since the electrical bond pads on the perimeter of the lower die extend beyond the edges of the smaller die on top. With same-size die stacking, the upper and lower dies are spaced more vertically apart to provide sufficient clearance for the wire bonds of the lower die. Then, once the dies are mounted, gold or aluminum bond wires are attached to connect the wire bonding pads on the upper die and on the lower die with the ends of their associated leadframe lead extensions.

Unfortunately, practices for same-size die stacking cause significant limitations in IC package density. Stacking arrangements must leave enough space between the upper die and the lower die for the wires. If the upper die is too close to the lower die, it can damage the lower die wires and cause short circuits. In order to prevent wire damage, some processes include supporting the upper die on separate pillars that hold the dies apart at a greater distance. Unfortunately, however, such pillars require extra components and extra assembly, which causes extra material costs, increases processing times, raises assembly costs, and increases overall product costs.

Thus, despite the advantages of recent developments in semiconductor fabrication and packaging techniques, there is a continuing need for improved packaging designs, systems, and methods to enable increased semiconductor die density in multi-chip same size die packages. In view of the need to increase package efficiency and capacity and to reduce package thicknesses, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system. A leadframe is provided having a short lead finger and a long lead finger, and the long lead finger and the short lead finger reside substantially within the same horizontal plane. A first die is placed in the leadframe. A second die is offset from the first die. The offset second die is attached over the first die and the long lead finger with an adhesive. The first die is electrically connected to the short lead finger. The second die is electrically connected to at least the long lead finger or the short lead finger. At least portions of the leadframe, the first die, and the second die are encapsulated in an encapsulant.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits and process steps are not disclosed in detail. Likewise, the drawings showing embodiments of the device are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1:
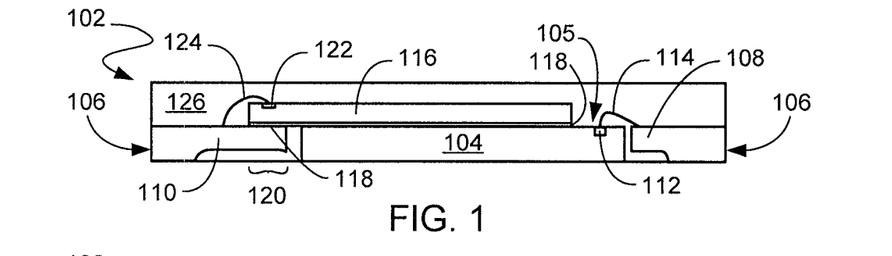
FIG. 1 is a cross sectional view of an integrated circuit package system according to an embodiment of the present invention.

Referring now to FIG. 1, therein is shown a cross sectional view of an integrated circuit package system 102 in accordance with an embodiment of the present invention. The integrated circuit package system 102 includes a first die 104 in a leadframe 106. The leadframe 106 has short lead fingers 108 and long lead fingers 110 on opposite sides of the first die 104. The short lead fingers 108 are shorter than the long lead fingers 110 and vice versa. The long lead finger and the short lead finger reside substantially within the same horizontal plane. The first die 104 has first contact pads 112 that are aligned to the short lead fingers 108. The first contact pads 112 electrically connect to the short lead fingers 108 with first wires 114. A second die 116 is attached to a top side 105 of the first die 104 and the long lead fingers 110 with an adhesive 118. The adhesive 118 is attached to the first die 104, the second die 116, and the long lead fingers 110 with the adhesive 118 being in direct contact the first die 104, in direct contact with the second die 116, and in direct contact with the long lead fingers 110. The second die 116 is offset from the first die 104 and is the same size or nearly the same size as the first die 104. The second die 116 rests on a distal portion 120 of the long lead fingers 110 and does not cover the first contact pads 112. The second die 116 has second contact pads 122 that are aligned to the long lead fingers 110. The second contact pads 122 electrically connect to the long lead fingers 110 with second wires 124. An encapsulant 126 encapsulates portions of the first die 104, portions of the leadframe 106, the second die 116, the first wires 114, and the second wires 124.

Typically, techniques for same size die stacking involve separating dies vertically for access to contact pads and wire bonding. It has been unexpectedly discovered that offsetting the second die 116 from the first die 104 and resting the second die 116 on the distal portion 120 of the long lead fingers 110 reduces the vertical size of the integrated circuit package system 102 and reduces process steps. By offsetting the second die 116 from the first die 104, the dies may be directly stacked on each other and access remains to the first contact pads 112 for electrical connection to the short lead fingers 108. Furthermore, by resting the second die 116 on the distal portion 120 of the long lead fingers 110, the long lead fingers 110 provide support to the second die 116, allowing simultaneous wire bonding of the first die 104 and the second die 116. Thus by eliminating the need to separate the dies vertically for electrical connection access and support for wire bonding, the integrated circuit package system 102 achieves a smaller size with fewer manufacturing steps then systems using such processes.

Figure 2:
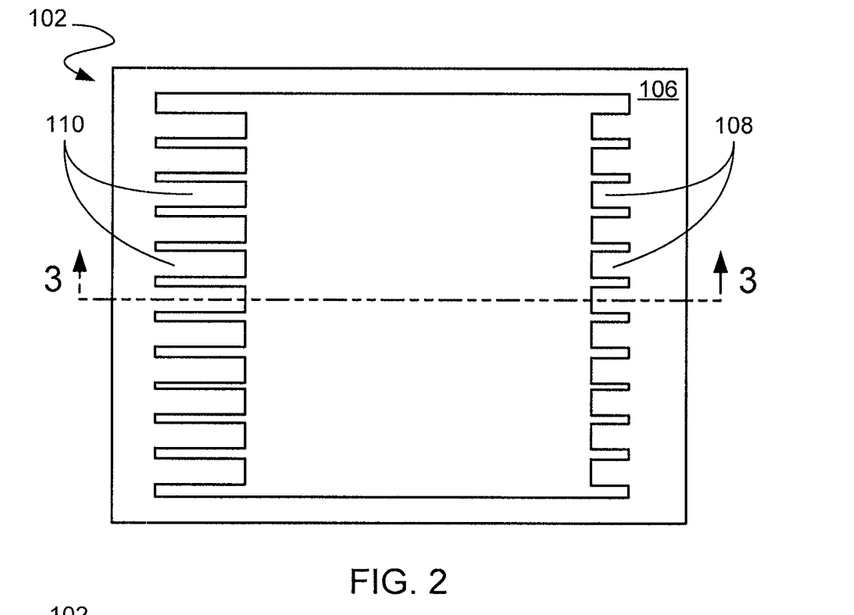
FIG. 2 is a plan view of the integrated circuit package system at an early stage of manufacture.

Referring now to FIG. 2, therein is shown a plan view of the integrated circuit package system 102 in an early stage of manufacture. Processing has formed the leadframe 106. On opposite sides of the leadframe 106 are the long lead fingers 110 and the short lead fingers 108.

Figure 3:
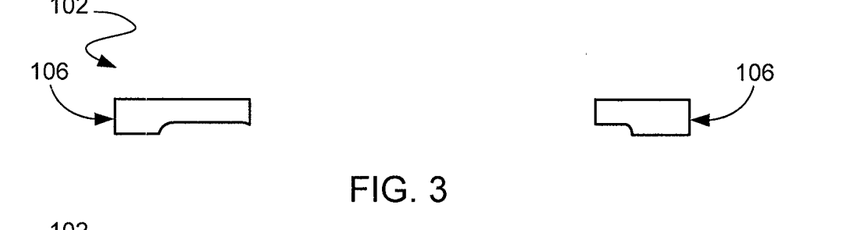
FIG. 3 is a cross sectional view of the structure shown in FIG. 2, taken along line 3-3 therein.

Referring now to FIG. 3, therein is shown a cross sectional view of the structure shown in FIG. 2, taken along line 3-3 therein.

Figure 4:
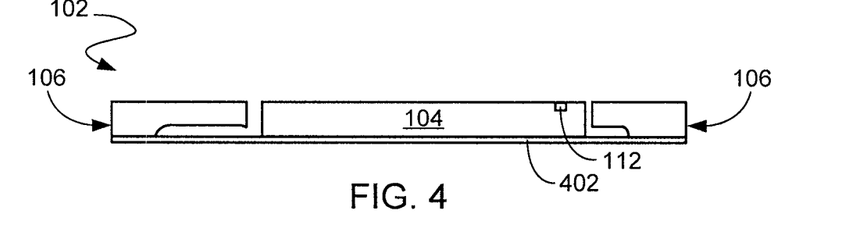
FIG. 4 is a view of the structure of FIG. 3 after placement of the first die.

Referring now to FIG. 4, therein is shown a view of the structure of FIG. 3, after further processing. The first die 104 has been placed within the leadframe 106 such that the first contact pads 112 are aligned with the short lead fingers 108. A coverlay 402 may optionally be used to support and secure the integrated circuit package system 102 during manufacture.

Figure 5:
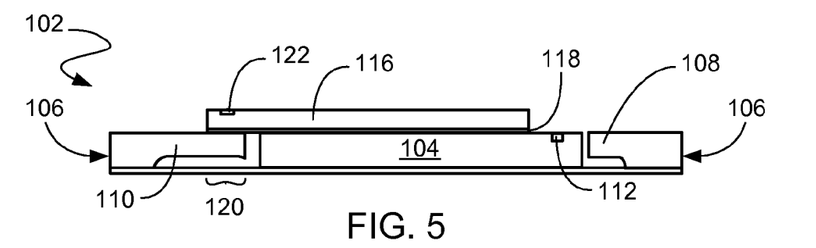
FIG. 5 is a view of the structure of FIG. 4 after attachment of the second die.

Referring now to FIG. 5, therein is shown a view of the structure of FIG. 4, after further processing. The second die 116 is attached to the top of the first die 104 and the distal portion 120 of the long lead fingers 110 with the adhesive 118 such that the second contact pads 122 are aligned with the long lead fingers 110. In this embodiment, the second die 116 is substantially the same size as the first die 104 and is offset from the first die 104. The long lead fingers 110 and the first die 104 provide support for the second die 116. Furthermore, the first contact pads 112 are left uncovered, thus allowing access for wire bonding.

Figure 6:
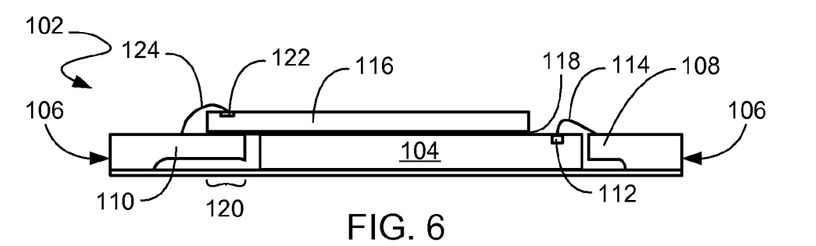
FIG. 6 is a cross sectional view of the structure shown in FIG. 7, taken along line 6-6 therein, after wire bonding.
Figure 7:
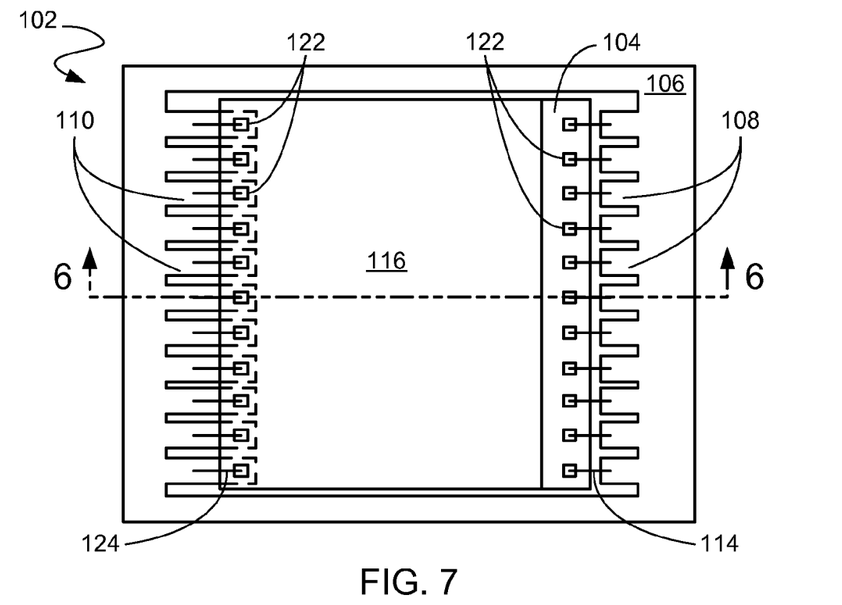
FIG. 7 is a plan view of the structure shown in FIG. 6.

Referring now to FIG. 6, therein is shown a cross sectional view of the structure shown in FIG. 7, taken along line 6-6 therein, after further processing. The first wires 114 electrically connect the first contact pads 112 on the first die 104 to the short lead fingers 108. In addition, the second wires 124 electrically connect the second contact pads 122 on the second die 116 to the long lead fingers 110.

Referring now to FIG. 7, therein is shown a plan view of the structure shown in FIG. 6.

Figure 8:
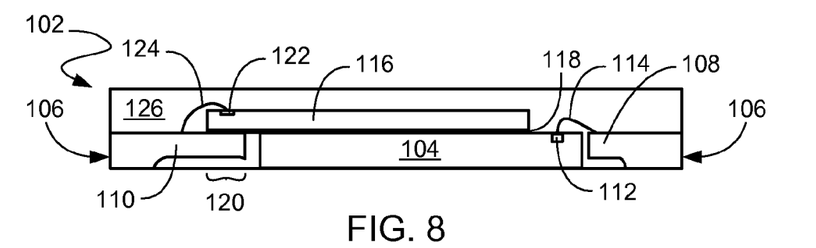
FIG. 8 is a view of the structure shown in FIG. 6 after encapsulation.

Referring now to FIG. 8, therein is shown a view of the structure shown in FIG. 6 after completed processing. The encapsulant 126 encapsulates portions of the first die 104, portions of the leadframe 106, the second die 116, the first wires 114, and the second wires 124. In addition, the coverlay 402 (FIG. 4), when used, has been removed. Thus, the bottom of the first die 104 and the bottoms of the long lead fingers 110 and the short lead fingers 108 are left exposed. These exposed portions aid in heat removal and electrical connections to larger systems.

Figure 9:
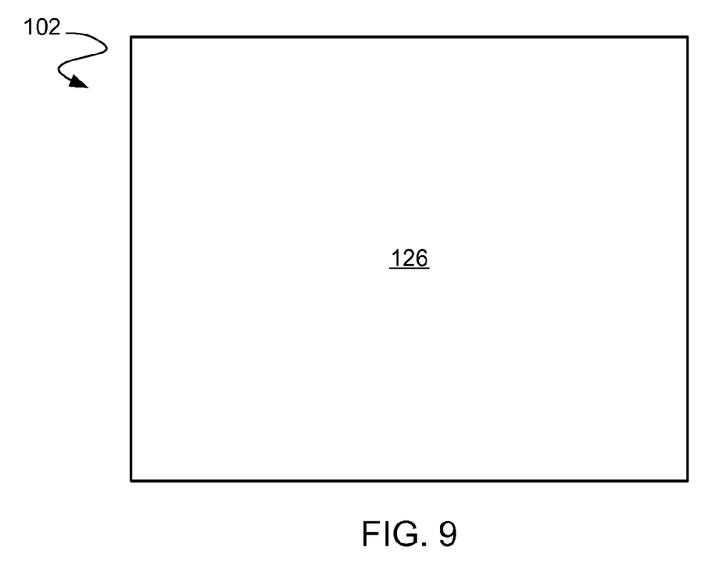
FIG. 9 is a top view of the integrated circuit package system after encapsulation.

Referring now to FIG. 9, therein is shown a top view of the integrated circuit package system 102 after completed processing.

Figure 10:
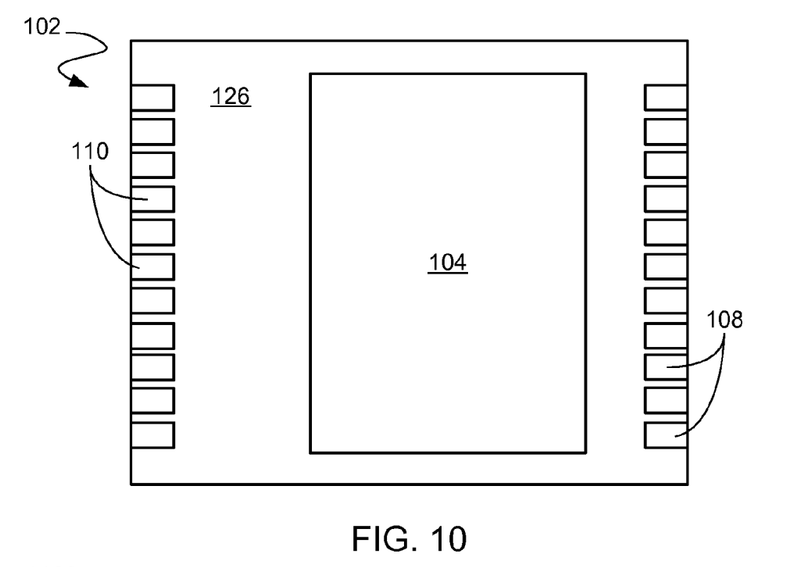
FIG. 10 is a bottom view of the integrated circuit package system after encapsulation.

Referring now to FIG. 10, therein is shown a bottom view of the integrated circuit package system 102 after completed processing.

Figure 11:
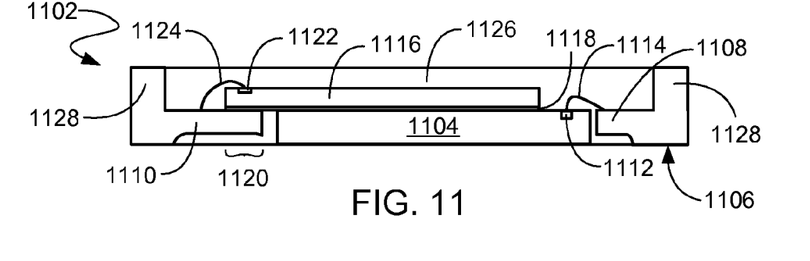
FIG. 11 is a cross sectional view of a supported integrated circuit package system according to an alternate embodiment of the present invention.

Referring now to FIG. 11, therein is shown a cross sectional view of a supported integrated circuit package system 1102 according to an alternate embodiment of the present invention. The supported integrated circuit package system 1102 includes a first die 1104 in a leadframe 1106. The leadframe 1106 has short lead fingers 1108 and long lead fingers 1110 on opposite sides of the first die 1104. In addition, the leadframe 1106 has supports 1128 on the ends of the short lead fingers 1108 and the long lead fingers 1110, opposite the first die 1104. The first die 1104 has first contact pads 1112 that electrically connect to the short lead fingers 1108 with first wires 1114. A second die 1116 is attached to the top of the first die 1104 and the long lead fingers 1110 with an adhesive 1118. The second die 1116 is offset from the first die 1104 and is the same size or nearly the same size as the first die 1104. The second die 1116 rests on a distal portion 1120 of the long lead fingers 1110 and does not cover the first contact pads 1112. The second die 1116 has second contact pads 1122 that electrically connect to the long lead fingers 1110 with second wires 1124. An encapsulant 1126 encapsulates portions of the first die 1104, portions of the leadframe 1106, the second die 1116, the first wires 1114, and the second wires 1124.

The supported integrated circuit package system 1102 has the advantages of the integrated circuit package system 102 (FIG. 1). In addition, the supports 1128 allow multiple supported integrated circuit package systems 1102 to be stacked (see FIG. 14).

Figure 12:
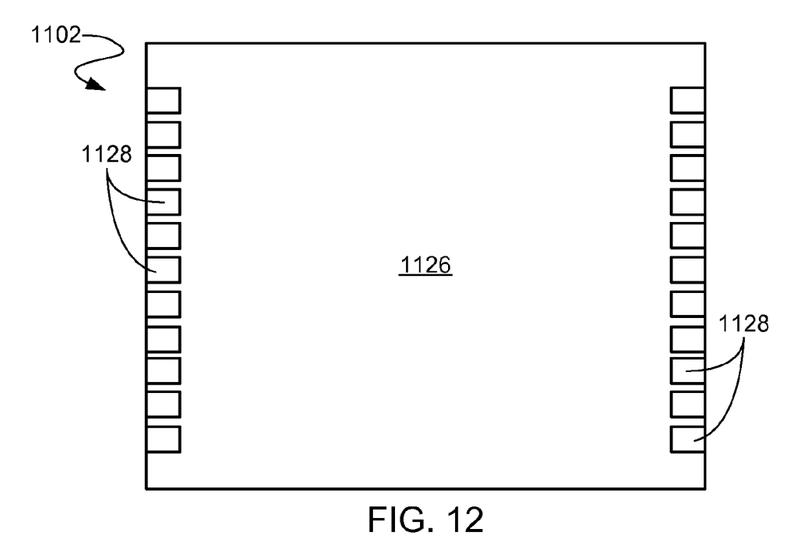
FIG. 12 is a top view of the supported integrated circuit package system.

Referring now to FIG. 12, therein is shown a top view of the supported integrated circuit package system 1102.

Figure 13:
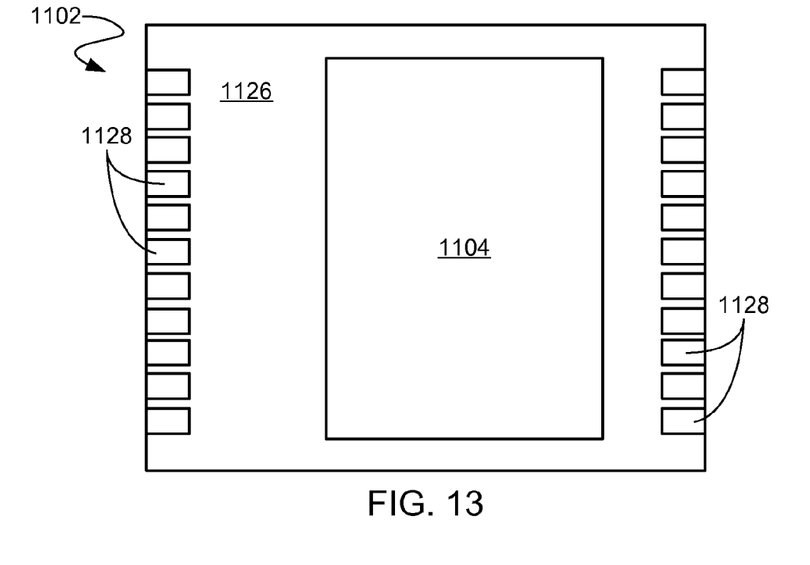
FIG. 13 is a bottom view of the supported integrated circuit package system.

Referring now to FIG. 13, therein is shown a bottom view of the supported integrated circuit package system 1102.

Figure 14:
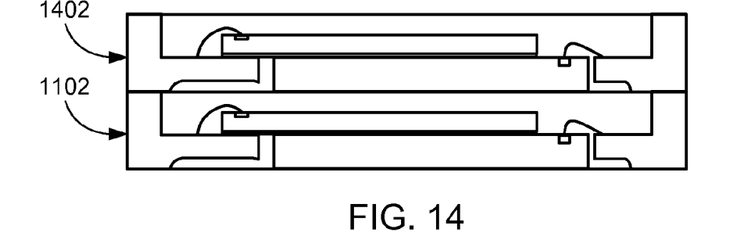
FIG. 14 is a cross sectional view of supported integrated circuit package systems stacked on one another.

Referring now to FIG. 14, therein is shown a cross sectional view of supported integrated circuit package system 1102 and a second supported integrated circuit package system 1402 stacked on one another.

Figure 15:
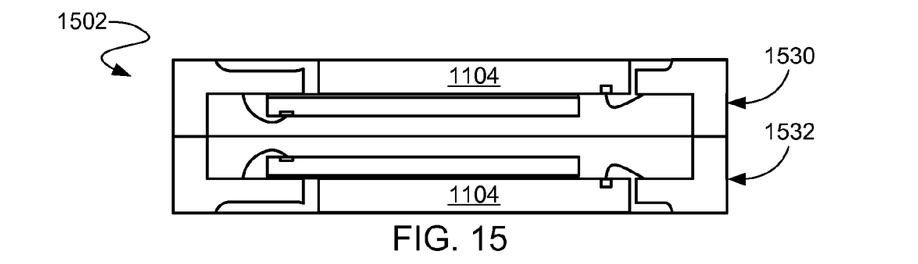
FIG. 15 is a cross sectional view of an inverted stacked integrated circuit package system according to an alternate embodiment of the present invention.

Referring now to FIG. 15, therein is shown a cross sectional view of an inverted stacked integrated circuit package system 1502 according to an alternate embodiment of the present invention. In this embodiment, a top supported integrated circuit package system 1530 is inverted and placed on a bottom supported integrated circuit package system 1532. Thus, the first dies 1104 are left exposed, improving heat removal.

Figure 16:
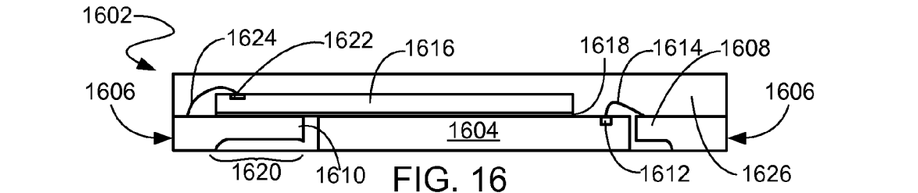
FIG. 16 is a cross sectional view of an integrated circuit package system according to an alternate embodiment of the present invention.

Referring now to FIG. 16, therein is shown a cross sectional view of an integrated circuit package system 1602 according to an alternate embodiment of the present invention. The integrated circuit package system 1602 includes a first die 1604 in a leadframe 1606. The leadframe 1606 has short lead fingers 1608 and long lead fingers 1610 on opposite sides of the first die 1604. The first die 1604 has first contact pads 1612 that electrically connect to the short lead fingers 1608 with first wires 1614. A second die 1616 is attached to the top of the first die 1604 and the long lead fingers 1610 with an adhesive 1618. The second die 1616 is offset from the first die 1604 and is significantly larger than the first die 1604. The second die 1616 rests on a significant portion 1620 of the long lead fingers 1610 and does not cover the first contact pads 1612. The second die 1616 has second contact pads 1622 that electrically connect to the long lead fingers 1610 with second wires 1624. An encapsulant 1626 encapsulates portions of the first die 1604, portions of the leadframe 1606, the second die 1616, the first wires 1614, and the second wires 1624.

The integrated circuit package system 1602 has the advantages of the integrated circuit package system 102 (FIG. 1). In addition, the significant portion 1620 provides increased support for wire bonding of the second die 1616.

Figure 17:
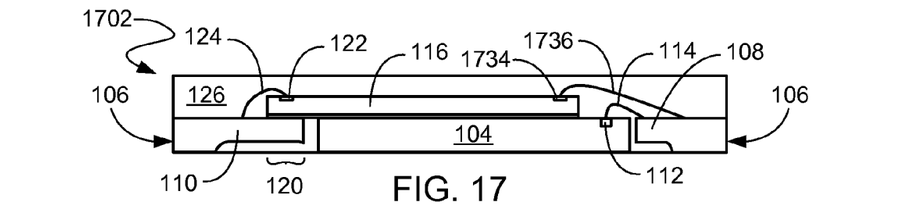
FIG. 17 is a cross sectional view of an integrated circuit package system with third contact pads according to an alternate embodiment of the present invention.

Referring now to FIG. 17, therein is shown a cross sectional view of an integrated circuit package system 1702 according to an alternate embodiment of the present invention. The integrated circuit package system 1702 is the same as the integrated circuit package system 102 (FIG. 1) with the addition of third contact pads 1734 on the second die 116. The third contact pads 1734 are located on the same side of the second die 116 as the first contact pads 112 on the first die 104. Third wires 1736 electrically connect the third contact pads 1734 to the short lead fingers 108.

Figure 18:
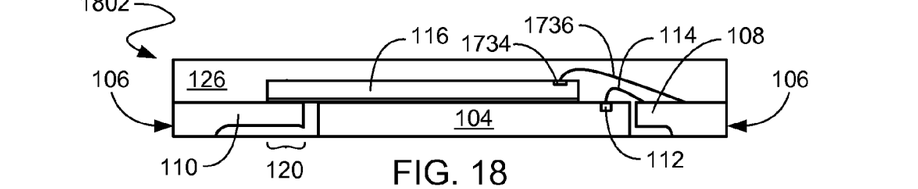
FIG. 18 is a cross sectional view of an integrated circuit package system with only first contact pads and third contact pads according to an alternate embodiment of the present invention.

Referring now to FIG. 18, therein is shown a cross sectional view of an integrated circuit package system 1802 according to an alternate embodiment of the present invention. The integrated circuit package system 1802 is the same as the integrated circuit package system 1702 (FIG. 17) except that there are only the first contact pads 112 and the third contact pads 1734.

Figure 19:
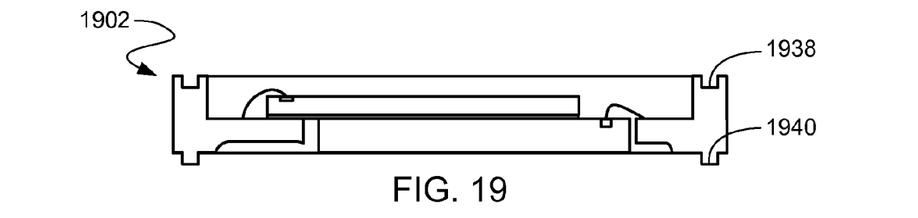
FIG. 19 is a cross sectional view of a supported integrated circuit package system with alignment slots and alignment posts according to an alternate embodiment of the present invention.

Referring now to FIG. 19, therein is shown a cross sectional view of a notched integrated circuit package system 1902 according to an alternate embodiment of the present invention. The notched integrated circuit package system 1902 is the same as the supported integrated circuit package system 1102 (FIG. 11) with the addition of alignment slots 1938 and alignment posts 1940. The alignment slots 1938 and the alignment posts 1940 assist aligning of multiple notched integrated circuit package systems 1902 during package stacking (see FIG. 20).

Figure 20:
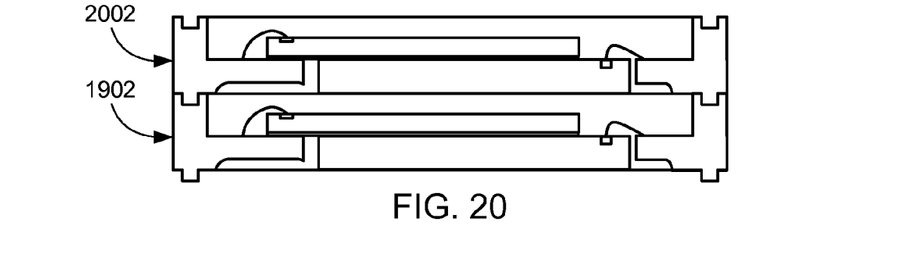
FIG. 20 is a cross sectional view of supported integrated circuit package systems with alignment slots and alignment posts stacked on one another.

Referring now to FIG. 20, therein is shown a cross sectional view of notched integrated circuit package system 1902 and a second notched integrated circuit package system 2002 stacked on one another by the alignment slots 1938 (FIG. 19) and the alignment posts 1940 (FIG. 19).

Figure 21:
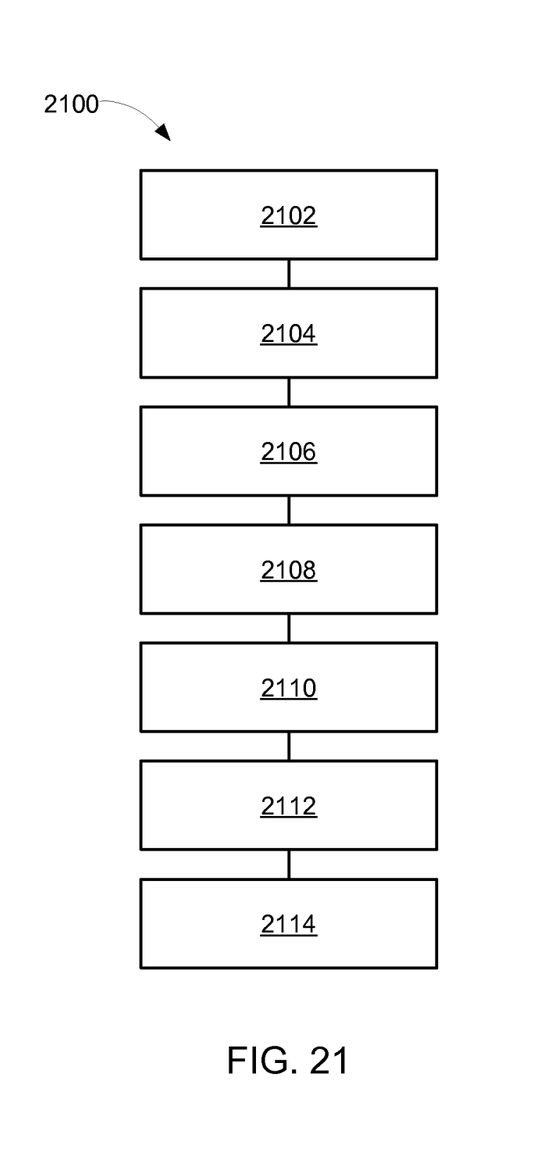
FIG. 21 is a flow chart of a system for an integrated circuit package system in accordance with an embodiment of the present invention.

Referring now to FIG. 21, therein is shown a flow chart of an integrated circuit package system 2100 in accordance with an embodiment of the present invention. The integrated circuit package system 2100 includes providing a leadframe having a short lead finger and a long lead finger in a block 2102; placing a first die in the leadframe in a block 2104; offsetting a second die from the first die in a block 2106; attaching the offset second die to the first die and the long lead finger with an adhesive in a block 2108; electrically connecting the first die to the short lead finger in a block 2110; electrically connecting the second die to at least the long lead finger or the short lead finger in a block 2112; and encapsulating at least portions of the leadframe, the first die, and the second die in an encapsulant in a block 2114.

Thus, it has been discovered that the integrated circuit package system of the present invention furnishes important and heretofore unknown and unavailable solutions, capabilities, and functional advantages for reducing the size and increasing the density in multi-chip same size die packages. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system, comprising:
a leadframe having a short lead finger and a long lead finger, and the long lead finger and the short lead finger reside substantially within the same horizontal plane;
a first die in the leadframe and electrically connected to the short lead finger;
a second die offset from the first die and electrically connected to at least the long lead finger or the short lead finger;
an adhesive attached to the first die, the second die, and the long lead finger with the second die over the first die and the long lead finger, the adhesive in direct contact with the first die, the adhesive in direct contact with the second die, and the adhesive in direct contact with the long lead finger; and
an encapsulant encapsulating at least portions of the leadframe, the first die, and the second die.

2. The system of claim 1 wherein:
the leadframe further comprises supports forming a supported package; and
further comprising:
a second supported package stacked on the supported package.

3. The system of claim 1 wherein:
the leadframe further comprises supports forming a supported package; and
further comprising:
a second supported package that is inverted and stacked on the supported package.

4. The system of claim 1 wherein the second die is larger than the first die.

5. The system of claim 1 further comprising:
a first wire electrically connecting the first die to the short lead finger;
a second wire electrically connecting the second die to the long lead finger; and
a third wire electrically connecting the second die to the short lead finger.

6. The system of claim 1 further comprising:
a first contact pad on the first die aligned to the short lead finger;
a second contact pad on the second die aligned to the long lead finger;
a first wire electrically connecting the first contact pad to the short lead finger;
a second wire electrically connecting the second contact pad to the long lead finger; and
wherein:
the short lead finger and the long lead finger are on opposite sides of the leadframe; and
the second die leaves the first contact pad uncovered.

7. The system of claim 6 wherein:
the leadframe further comprises supports forming a supported package; and
further comprising:
a second supported package that is inverted and stacked on the supported package.

8. The system of claim 6 wherein the second die is larger than the first die.

9. The system of claim 6 further comprising a third wire electrically connecting the second die to the short lead finger.

* * * * *